United States Patent
Bolz et al.

(10) Patent No.: US 9,567,664 B2
(45) Date of Patent: *Feb. 14, 2017

(54) CERAMIC THERMAL BARRIER COATING SYSTEM WITH TWO CERAMIC LAYERS

(75) Inventors: Andrea Bolz, Berlin (DE); Eckart Schumann, Mülheim an der Ruhr (DE); Ramesh Subramanian, Oviedo, FL (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 1046 days.

This patent is subject to a terminal disclaimer.

(21) Appl. No.: 12/471,710

(22) Filed: May 26, 2009

(65) Prior Publication Data

US 2010/0015401 A1    Jan. 21, 2010

(30) Foreign Application Priority Data

May 26, 2008 (EP) .................................. 08009565

(51) Int. Cl.

| | |
|---|---|
| *B32B 3/00* | (2006.01) |
| *B32B 7/02* | (2006.01) |
| *C23C 14/08* | (2006.01) |
| *F01D 5/28* | (2006.01) |
| *C23C 28/04* | (2006.01) |
| *C23C 28/00* | (2006.01) |

(52) U.S. Cl.
CPC ........... *C23C 14/083* (2013.01); *C23C 28/042* (2013.01); *C23C 28/3215* (2013.01); *C23C 28/345* (2013.01); *C23C 28/3455* (2013.01); *F01D 5/288* (2013.01); *F05D 2230/90* (2013.01); *F05D 2300/611* (2013.01); *Y02T 50/67* (2013.01); *Y02T 50/673* (2013.01); *Y10T 428/24612* (2015.01)

(58) Field of Classification Search
USPC ......................................... 428/213, 220, 172
See application file for complete search history.

(56) References Cited

U.S. PATENT DOCUMENTS

| | | |
|---|---|---|
| 4,299,865 A | 11/1981 | Clingman et al. |
| 5,209,645 A | 5/1993 | Kojima et al. |
| 5,630,314 A | 5/1997 | Kojima et al. |
| 5,667,641 A * | 9/1997 | Poirier et al. ................. 162/207 |
| 5,840,434 A | 11/1998 | Kojima et al. |
| 6,024,792 A | 2/2000 | Kurz et al. |

(Continued)

FOREIGN PATENT DOCUMENTS

| | | |
|---|---|---|
| CN | 1490360 A | 4/2004 |
| CN | 1657653 A | 8/2005 |

(Continued)

OTHER PUBLICATIONS

Communication from European Patent office stating cited references, Jan. 30, 2012, pp. 1-5.

*Primary Examiner* — Aaron Austin
*Assistant Examiner* — Megha Gaitonde

(57) ABSTRACT

A thermal barrier coating including a two layered ceramic barrier coating, an inner ceramic layer and an outer ceramic layer, is provided. The thermal barrier coating has different thicknesses on different places of the component. In addition, the thickness of the inner ceramic layer and the thickness of the outer ceramic layer vary in relation to one another.

11 Claims, 4 Drawing Sheets

(56) References Cited

U.S. PATENT DOCUMENTS

| | | |
|---|---|---|
| 7,306,859 B2 | 12/2007 | Wortman et al. |
| 2002/0102360 A1 | 8/2002 | Subramanian et al. |
| 2007/0036997 A1 | 2/2007 | Floyd |
| 2008/0292859 A1* | 11/2008 | Subramanian ................ 428/220 |

FOREIGN PATENT DOCUMENTS

| | | |
|---|---|---|
| EP | 486489 B1 | 11/1994 |
| EP | 412397 61 | 3/1998 |
| EP | 892090 A1 | 1/1999 |
| EP | 786017 B1 | 3/1999 |
| EP | 1283278 A2 | 2/2003 |
| EP | 1306454 A1 | 5/2003 |
| EP | 1319729 A1 | 6/2003 |
| EP | 1204776 B1 | 6/2004 |
| EP | 1541808 A1 | 6/2005 |
| EP | 1541810 A1 | 6/2005 |
| EP | 1686199 A2 | 8/2006 |
| GB | 2 431 932 * | 5/2007 |
| GB | 2431932 A | 5/2007 |
| WO | WO 9967435 A1 | 12/1999 |
| WO | WO 0044949 A1 | 8/2000 |
| WO | WO 2007115839 A2 | 10/2007 |

* cited by examiner

FIG 7

| Werkstoff | C | Cr | Ni | Co | Mo | W | Ta | Nb | Al | Ti | B | Zr | Hf |
|---|---|---|---|---|---|---|---|---|---|---|---|---|---|
| Ni-Basis-Feingußlegierungen | | | | | | | | | | | | | |
| GTD 222 | 0.10 | 22.5 | Rest | 19.0 | | 2.0 | 1.0 | | 1.2 | 2.3 | 0.008 | | |
| IN 939 | 0.15 | 22.4 | Rest | 19.0 | | 2.0 | 1.4 | 1.0 | 1.9 | 3.7 | 0.009 | 0.10 | |
| IN 6203 DS | 0.15 | 22.0 | Rest | 19.0 | | 2.0 | 1.1 | 0.8 | 2.3 | 3.5 | 0.010 | 0.10 | 0.75 |
| Udimet 500 | 0.10 | 18.0 | Rest | 18.5 | 4.0 | | | | 2.9 | 2.9 | 0.006 | 0.05 | |
| IN 738 LC | 0.10 | 16.0 | Rest | 8.5 | 1.7 | 2.6 | 1.7 | 0.9 | 3.4 | 3.4 | 0.010 | 0.10 | |
| SC 16 | <0.01 | 16.0 | Rest | | 3.0 | | 3.5 | | 3.5 | 3.5 | <0.005 | <0.008 | |
| Rene 80 | 0.17 | 14.0 | Rest | 9.5 | 4.0 | 4.0 | | | 3.0 | 5.0 | 0.015 | 0.03 | |
| GTD 111 | 0.10 | 14.0 | Rest | 9.5 | 1.5 | 3.8 | 2.8 | | 3.0 | 4.9 | 0.012 | 0.03 | |
| GTD 111 DS | | | | | | | | | | | | | |
| IN 792 CC | 0.08 | 12.5 | Rest | 9.0 | 1.9 | 4.1 | 4.1 | | 3.4 | 3.8 | 0.015 | 0.02 | 1.00 |
| IN 792 DS | 0.08 | 12.5 | Rest | 9.0 | 1.9 | 4.1 | 4.1 | | 3.4 | 3.8 | 0.015 | 0.02 | |
| MAR M 002 | 0.15 | 9.0 | Rest | 10.0 | | 10.0 | 2.5 | | 5.5 | 1.5 | 0.015 | 0.05 | 1.50 |
| MAR M 247 LC DS | 0.07 | 8.1 | Rest | 9.2 | 0.5 | 9.5 | 3.2 | | 5.6 | 0.7 | 0.015 | 0.02 | 1.40 |
| CMSX-2 | <.006 | 8.0 | Rest | 4.6 | 0.6 | 8.0 | 6.0 | | 5.6 | 1.0 | <.003 | <.0075 | |
| CMSX-3 | <.006 | 8.0 | Rest | 4.6 | 0.6 | 8.0 | 6.0 | | 5.6 | 1.0 | <.003 | <.0075 | 0.10 |
| CMSX-4 | | 6.0 | | 10.0 | 0.6 | 6.0 | 6.0 | | 5.6 | 1.0 | | Re=3.0 | 0.10 |
| CMSX-6 | <.015 | 10.0 | Rest | 5.0 | 3.0 | <.10 | 2.0 | <.10 | 4.9 | 4.8 | <.003 | <.0075 | 0.10 |
| PWA 1480 SX | <.006 | 10.0 | Rest | 5.0 | | 4.0 | 12.0 | | 5.0 | 1.5 | <.0075 | <.0075 | |
| PWA 1483 SX | 0.07 | 12.2 | Rest | 9.0 | 1.9 | 3.8 | 5.0 | | 3.6 | 4.2 | 0.0001 | 0.002 | |
| Co-Basis-Feingußlegierungen | | | | | | | | | | | | | |
| FSX 414 | 0.25 | 29.0 | 10 | Rest | | 7.5 | | | | | 0.010 | | |
| X 45 | 0.25 | 25.0 | 10 | Rest | | 8.0 | | | | | 0.010 | | |
| ECY 768 | 0.65 | 24.0 | 10 | 51.7 | | 7.5 | 4.0 | | 0.25 | 0.3 | 0.010 | 0.05 | |
| MAR-M-509 | 0.65 | 24.5 | 11 | Rest | | 7.5 | 4 | | | 0.3 | 0.010 | 0.60 | |
| CM 247 | 0.07 | 8.3 | Rest | 10.0 | 0.5 | 9.5 | 3.2 | | 5.5 | 0.7 | | | 1.5 |

CERAMIC THERMAL BARRIER COATING SYSTEM WITH TWO CERAMIC LAYERS

CROSS REFERENCE TO RELATED APPLICATIONS

This application claims priority of European Patent Office application No. 08009565.6 EP filed May 26, 2008, which is incorporated by reference herein in its entirety.

FIELD OF INVENTION

The invention relates to a thermal barrier coating system made of two ceramic layers according to the claims.

BACKGROUND OF INVENTION

U.S. Pat. No. 4,299,865 discloses a two layered ceramic thermal barrier coating with an outer layer which has a very high porosity between 20 vol. % and 33 vol. % and a dense inner ceramic thermal barrier layer.

Thermal barrier coatings are substantially function layers and are attended to protect the substrate against excessive heat. The substrate has a sufficiently high mechanical strength and the thermal barrier coatings are likewise exposed to thermal strength and mechanical stresses and may fail as result of cracks.

SUMMARY OF INVENTION

Therefore, it is an object of the invention to provide a thermal barrier coating and a component in which the layers are better able to withstand thermal and mechanical stresses.

This object is achieved by a thermal barrier coating system according to the claims.

BRIEF DESCRIPTION OF THE DRAWINGS

FIG. 7 shows a list of super alloys.

DETAILED DESCRIPTION OF INVENTION

Only Exemplary embodiments of the invention are shown in the figures.

Figure 1:
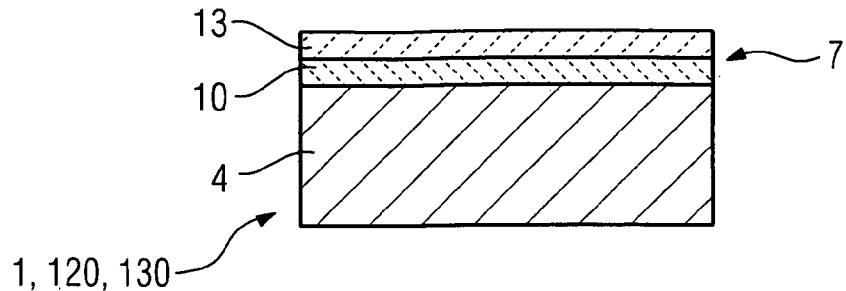
FIGS. 1, 3, 4 shows a cross section of a thermal barrier coating.

FIG. 1 shows an example of a thermal barrier coating 7.

Figure 5:
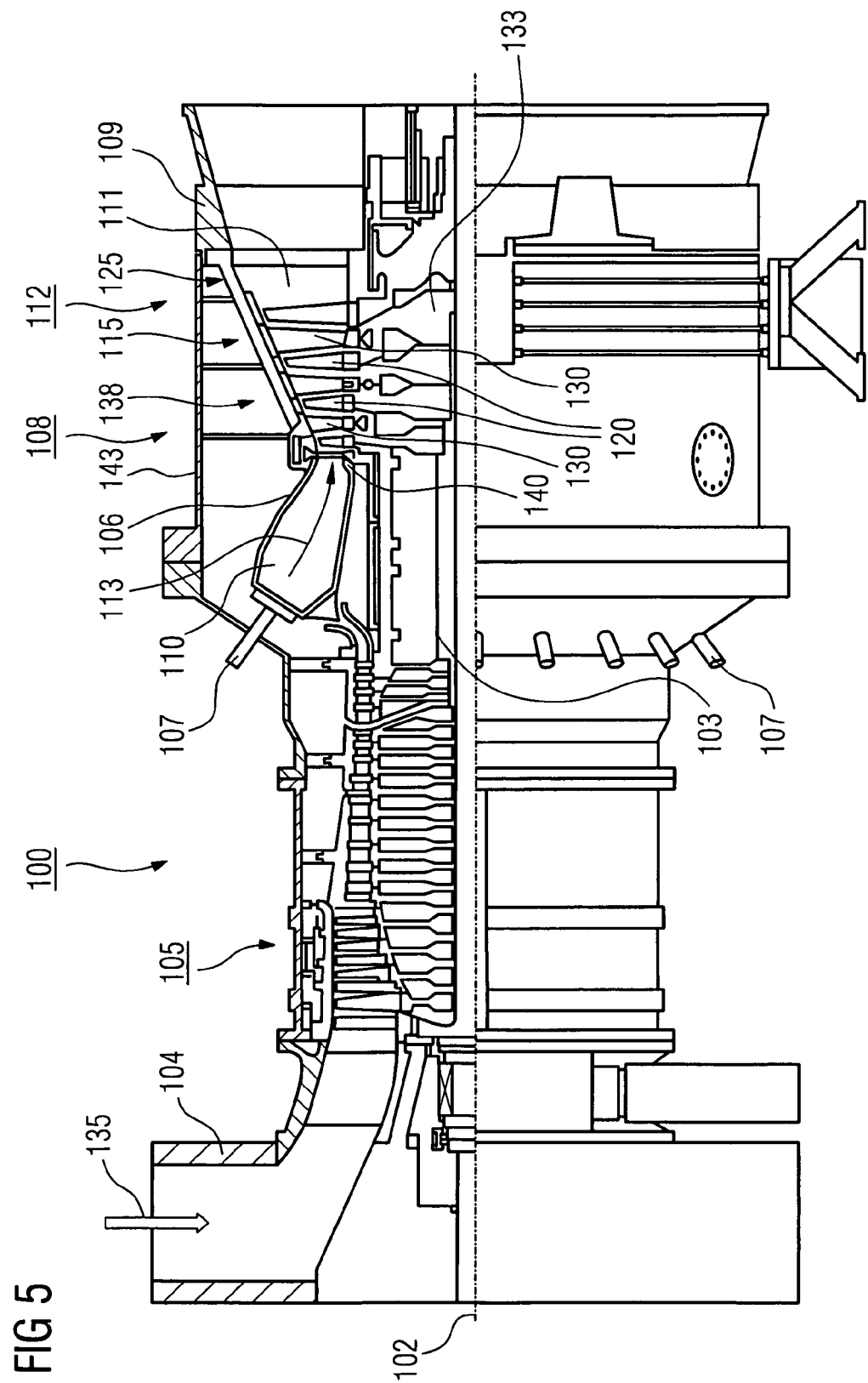
FIG. 5 shows a gas turbine.

A thermal barrier coating system 1, 120, 130 comprises a metallic substrate 4 which is preferably a cobalt or nickel based material especially made of one of superalloy given in FIG. 7 and is a component 120, 130 (FIG. 6) for a gas turbine 100 (FIG. 5)

Preferably a metallic bonding layer preferably of the MCrAlX alloy is applied onto the substrate 4 and under the thermal barrier coating 7 (not shown).

Preferably a thermally grown oxide layer (TGO) is formed on this metallic bonding layer or on the substrate 4 during operation or before applying the ceramic coating 7 (not shown).

An at least two layered ceramic thermal barrier coating 7 is applied (FIG. 1, 3, 4) on the substrate 4. The thermal barrier coating 7 (TBC) comprises two layers 10, 13. Especially the TBC 7 consists of two ceramic layers 10, 13.

The outermost layer 13 is especially made of a porous structure.

Very preferred materials for this porous structure of the outer layer 13 are gadolinium hafnat (e. g. $Gd_2Hf_2O_7$) or gadolinium zirconat (e.g. $Gd_2Zr_2O_7$).

The inner or under laying ceramic thermal barrier layer 10 is applied on the metallic bond coat or on the substrate 4 and is preferably made of at least partially stabilized zirconia.

The porosity of the layers 10, 13 is preferably lower than 20%.

The total thickness of the ceramic thermal barrier coating 7, which can be calculated from the layer thicknesses of the layers 10, 13 varies on different places 403, 406 (FIG. 2, 3) of the substrate 4. But the relation of the thicknesses of the separate layers 10, 13 can vary on different places 403, 406 on the substrate 4.

There is preferably no metallic layer between the inner 10 and outer 13 ceramic layer.

Figure 2:
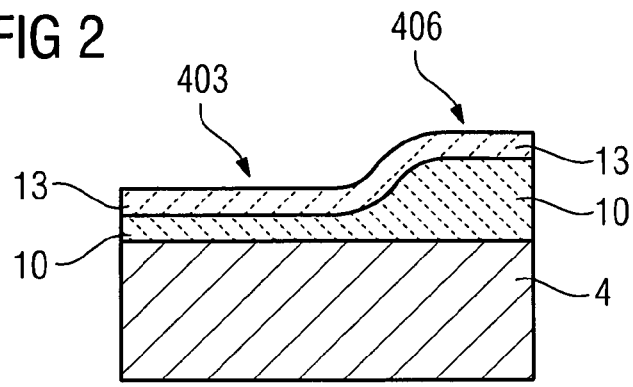
FIG. 2 shows one component with a thermal barrier coating.

In FIG. 2 a turbine blade 120, 130 is shown with an airfoil 406 and a platform 403.

Figure 3:
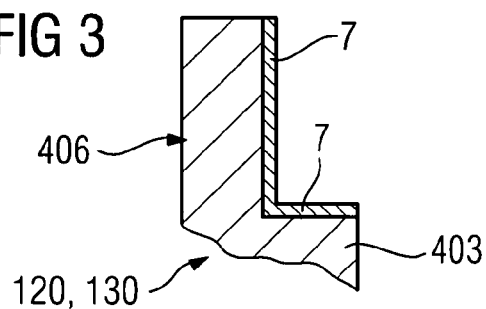

On the airfoil 406 the ceramic coating 7 is thicker (FIG. 3) than on the platform 403. But the thickness of the ceramic coating 7 on the airfoil 406 is mostly, preferably only increased by the increase of the thickness of the outer layer 13. This has the advantage of only changing the coating parameters of the outer layer 13.

Especially on the airfoil 406 the outer layer 13 is at least twice thick as the underlying layer 10. Very especially the outer layer 13 is about twice thick as the underlying layer 10.

On the platform 403 the outer layer 13 has preferably the same thickness as the underlying ceramic layer 10.

The inner ceramic layer 10 comprises preferably zirconia ($ZrO_2$) preferably at least partially stabilized zirconia.

The outer ceramic layer 13 comprises preferably a pyrochlor structure.

Figure 4:
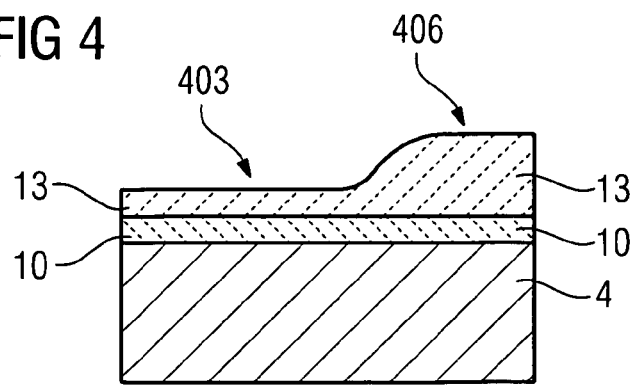

Also it is possible that the outer layer 13 has the same thickness on different places 403, 406 and the difference of the thickness is reached only by an increase of the thickness of the inner layer 10 (FIG. 4).

Figure 6:
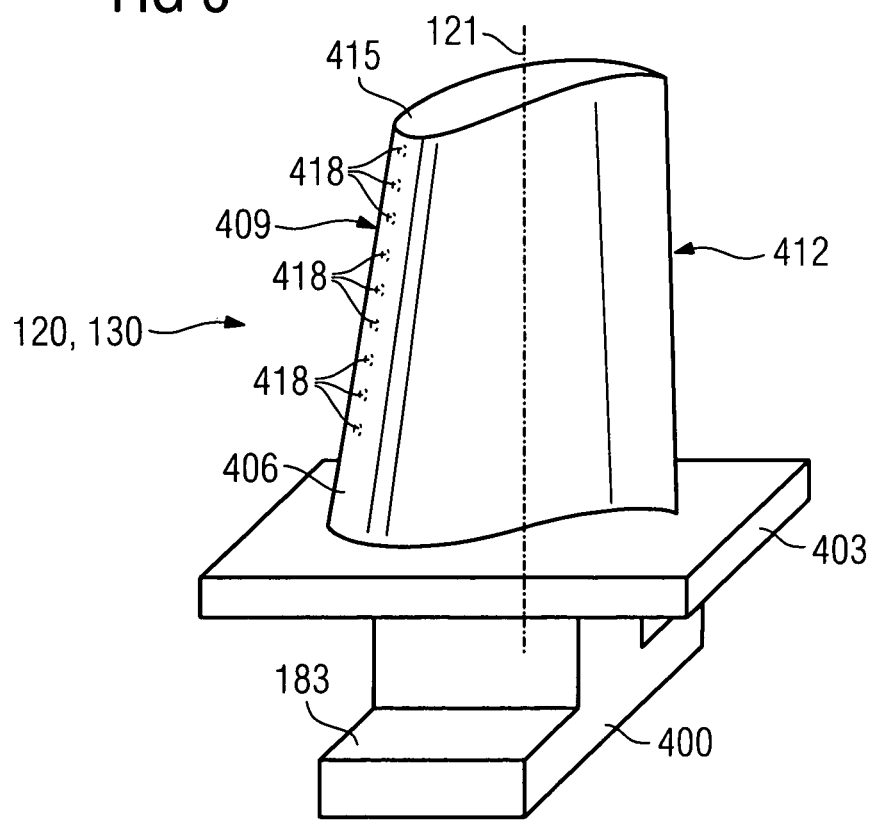
FIG. 6 shows in a perspective view a blade or vane.

FIG. 6 shows a perspective view of a rotor blade 120 or guide vane 130 of a turbo machine, which extends along a longitudinal axis 121.

The turbo machine may be a gas turbine of an aircraft or of a power plant for generating electricity, a steam turbine or a compressor.

The blade or vane 120, 130 has a securing region 400, an adjoining blade or vane platform 403 and a main blade or main part 406 in succession along the longitudinal axis 121. As guide vane 130, the vane 130 may have a further platform (not shown) at its vane tip 415.

A blade or vane root 183, which is used to secure the rotor blades 120, 130 to a shaft or disk (not shown), is formed in the securing region 400. The blade or vane root 183 is designed, for example, in hammerhead form. Other configurations, such as fir-tree or dovetail root, are also possible. The blade or vane 120, 130 has a leading edge 409 and a trailing edge 412 for a medium which flows past the main blade or vane part 406.

In the case of conventional blades or vanes 120, 130, by way of example, solid metallic materials, in particular superalloys, are used in all regions 400, 403, 406 of the blade or vane 120, 130. Superalloys of this type are known, for example, from EP 1 204 776 B1, EP 1 306 454, EP 1 319 729 A1, WO 99/67435 or WO 00/44949; these documents form part of the present disclosure with regard to the chemical composition of the alloy. The blade or vane 120, 130 may in this case be produced by a casting process, also by means of directional solidification, by a forging process, by a milling process or combinations thereof.

Work pieces with a single-crystal structure or structures are used as components for machines which are exposed to high mechanical, thermal and/or chemical loads during operation. Single-crystal work pieces of this type are produced, for example, by directional solidification from the melt. This involves casting processes in which the liquid metallic alloy is solidified to form the single-crystal structure, i.e. the single-crystal work piece, i.e. directionally. In the process, dendritic crystals are formed in the direction of the heat flux and form either a columnar-crystalline grain structure (i.e. with grains which run over the entire length of the work piece and are referred to in this context, in accordance with the standard terminology, as directionally solidified) or a single-crystal structure, i.e. the entire work piece consists of a single crystal. In this process, the transition to globular (polycrystalline) solidification needs to be avoided, since non-directional growth inevitably leads to the formation of transverse and longitudinal grain boundaries, which negate the good properties of the directionally solidified or single-crystal component. Where directionally solidified microstructures are referred to in general, this is to be understood as encompassing both single crystals, which do not have any grain boundaries or at most have small-angle grain boundaries, and columnar crystal structures, which do have grain boundaries running in the longitudinal direction, but do not have any transverse grain boundaries. In the case of these latter crystalline structures, it is also possible to refer to directionally solidified microstructures (directionally solidified structures). Processes of this type are known from U.S. Pat. No. 6,024,792 and EP 0 892 090 A1.

The blades or vanes 120, 130 may also have coatings protecting against corrosion or oxidation, e.g. (MCrAlX; M is at least one element selected from the group consisting of iron (Fe), cobalt (Co), nickel (Ni), X is an active element and stands for yttrium (Y) and/or silicon and/or at least one rare earth element, or hafnium (Hf)). Alloys of this type are known from EP 0 486 489 B1, EP 0 786 017 B1, EP 0 412 397 B1 or EP 1 306 454 A1.

It is also possible for a thermal barrier coating consisting, for example, of $ZrO_2$, $Y_2O_4$—$ZrO_2$, i.e. which is not, is partially or is completely stabilized by yttrium oxide and/or calcium oxide and/or magnesium oxide, to be present on the MCrAlX. Columnar grains are produced in the thermal barrier coating by suitable coating processes, such as for example electron beam physical vapor deposition (EB-PVD).

The term refurbishment means that protective layers may have to be removed from components 120, 130 after they have been used (for example by sandblasting). Then, the corrosion and/or oxidation layers or products are removed. If necessary, cracks in the component 120, 130 are also repaired using the solder according to the invention. This is followed by recoating of the component 120, 130, after which the component 120, 130 can be used again.

The blade or vane 120, 130 may be of solid or hollow design. If the blade or vane 120, 130 is to be cooled, it is hollow and may also include film cooling holes 418 (indicated by dashed lines).

FIG. 5 shows, by way of example, a gas turbine 100 in the form of a longitudinal part section. In its interior, the gas turbine 100 has a rotor 103, which is mounted such that it can rotate about an axis of rotation 102 and has a shaft, also known as the turbine rotor. An intake housing 104, a compressor 105 a, for example toroidal, combustion chamber 110, in particular an annular combustion chamber, with a plurality of coaxially arranged burners 107, a turbine 108 and the exhaust casing 109 follow one another along the rotor 103. The annular combustion chamber 110 is in communication with a, for example annular, hot gas duct 111 where, for example, four successive turbine stages 112 form the turbine 108.

Each turbine stage 112 is formed, for example, from two blade or vane rings. As seen in the direction of flow of a working medium 113, a row 125 formed from rotor blades 120 follows a row 115 of guide vanes in the hot-gas duct 111.

The guide vanes 130 are secured to an inner housing 138 of a stator 143, whereas the rotor blades 120 of a row 125 are fitted to the rotor 103, for example by means of a turbine disk 133. A generator or machine (not shown) is coupled to the rotor 103.

When the gas turbine 100 is operating, the compressor 105 sucks in air 135 through the intake housing 104 and compresses it. The compressed air which is provided at the turbine-side end of the compressor 105 is passed to the burners 107, where it is mixed with a fuel. The mixture is then burnt in the combustion chamber 110 to form the working medium 133. From there, the working medium 133 flows along the hot-gas duct 111 past the guide vanes 130 and the rotor blades 120. The working medium 113 expands at the rotor blades 120, transferring its momentum, so that the rotor blades 120 drive the rotor 103 and the rotor drives the machine coupled to it.

When the gas turbine 100 is operating, the components which are exposed to the hot working medium 113 are subject to thermal loads. The guide vanes 130 and rotor blades 120 of the first turbine stage 112, as seen in the direction of flow of the working medium 113, together with the heat shield elements which line the annular combustion chamber 110, are subject to the highest thermal loads. To withstand the temperatures prevailing there, these components can be cooled by means of a coolant.

It is likewise possible for substrates of the components to have a directional structure, i.e. they are in single-crystal form (SX structure) or include only longitudinally directed grains (DS structure). By way of example, iron-base, nickel-base or cobalt-base superalloys are used as material for the components, in particular for the turbine blades and vanes 120, 130 and components of the combustion chamber 110. Superalloys of this type are known, for example, from EP 1 204 776 B1, EP 1 306 454, EP 1 319 729 A1, WO 99/67435 or WO 00/44949; these documents form part of the present disclosure with regard to the chemical composition of the alloys.

The blades and vanes 120, 130 may likewise have coatings to protect against corrosion (MCrAlX; M is at least one element selected from the group consisting of iron (Fe), cobalt (Co), nickel (Ni), X is an active element and stands for yttrium (Y) and/or silicon and/or at least one of the rare earth elements or hafnium). Alloys of this type are known from EP 0 486 489 B1, EP 0 786 017 B1, EP 0 412 397 B1 or EP 1 306 454 A1.

A thermal barrier coating consisting, for example, of $ZrO_2$, $Y_2O_4$—$ZrO_2$, i.e. it is not, is partially or is completely stabilized by yttrium oxide and/or calcium oxide and/or magnesium oxide may also be present on the MCrAlX. Columnar grains are produced in the thermal barrier coating by suitable coating processes, such as for example electron beam physical vapor deposition (EB-PVD).

The guide vane 130 has a guide vane root (not shown here) facing the inner housing 138 of the turbine 108 and a guide vane head on the opposite side from the guide vane root. The guide vane head faces the rotor 103 and is fixed to a securing ring 140 of the stator 143.

The invention claimed is:

1. A thermal barrier coating system for a turbine blade having an airfoil attached to a platform, comprising
 a substrate including the airfoil and the platform;
 a ceramic coating having two ceramic layers, comprising:
  an inner ceramic layer having a first thickness; and
  an outer ceramic layer having a second thickness,
 wherein the ceramic coating is applied on the airfoil and platform, and a thickness of the ceramic coating across the airfoil is thicker than a thickness of the ceramic coating across the platform; and,
 wherein the second thickness of the outer ceramic layer on the airfoil is greater than the first thickness of the inner ceramic layer on the airfoil, and, wherein the first thickness of the inner ceramic layer and the second thickness of the outer ceramic layer on the platform are substantially equal.

2. A thermal barrier coating system as claimed in claim 1, wherein the second thickness is twice as thick on the airfoil than the second thickness on the platform.

3. A thermal barrier coating system as claimed in claim 1, wherein the inner ceramic layer comprises zirconia.

4. A thermal barrier coating system as claimed in claim 1, wherein the outer ceramic layer comprises a pyrochlore structure.

5. A thermal barrier coating system as claimed in claim 1, wherein a porosity of the inner layer is less than 20 vol %.

6. A thermal barrier coating system as claimed in claim 1, wherein the porosity of the inner layer is less than 15 vol %.

7. A thermal barrier coating system as claimed in claim 1, wherein the porosity of the outer layer is less than 20 vol %.

8. A thermal barrier coating system as claimed in claim 1, wherein the porosity of the outer layer is less than 15 vol %.

9. A thermal barrier coating system as claimed in claim 1, wherein a material used for the outer ceramic layer is gadolinium hafnat or gadolinium zirconat.

10. A thermal barrier coating system as claimed in claim 1,
 wherein the thermal barrier coating system is used on a component, and
 wherein the component is a turbine blade.

11. A thermal barrier coating system as claimed in claim 10, wherein a metallic layer is not present between the inner ceramic layer and the outer ceramic layer.

* * * * *